United States Patent
Suzuki et al.

(10) Patent No.: US 8,498,139 B2
(45) Date of Patent: Jul. 30, 2013

(54) SEMICONDUCTOR STORAGE DEVICE

(75) Inventors: Yuya Suzuki, Kamakura (JP); Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 152 days.

(21) Appl. No.: 13/224,504

(22) Filed: Sep. 2, 2011

(65) Prior Publication Data

US 2012/0069656 A1   Mar. 22, 2012

(30) Foreign Application Priority Data

Sep. 22, 2010   (JP) .................................. 2010-212378

(51) Int. Cl.
*G11C 5/02* (2006.01)
*G11C 5/06* (2006.01)
*G11C 16/06* (2006.01)
*G11C 7/10* (2006.01)

(52) U.S. Cl.
USPC ..... 365/51; 365/63; 365/185.21; 365/189.05; 365/189.15

(58) Field of Classification Search
USPC .......................................................... 365/51
See application file for complete search history.

(56) References Cited

U.S. PATENT DOCUMENTS

| | | | |
|---|---|---|---|
| 6,597,599 B2 * | 7/2003 | Morihara et al. | 365/149 |
| 7,274,617 B2 | 9/2007 | Sakurai et al. | |
| 2011/0194349 A1 | 8/2011 | Noda | |
| 2011/0310684 A1 * | 12/2011 | Yamagami | 365/194 |
| 2012/0213010 A1 * | 8/2012 | Wu et al. | 365/189.05 |

FOREIGN PATENT DOCUMENTS

JP   2006-147111   6/2006

\* cited by examiner

*Primary Examiner* — Son Mai
(74) *Attorney, Agent, or Firm* — Oblon, Spivak, McClelland, Maier & Neustadt, L.L.P.

(57) ABSTRACT

A memory includes plurality of word lines extending in a first direction, plurality of bit lines extending in a second direction to intersect with the word lines, and a memory cell array including plurality of memory cells connected to the word lines and the bit lines. Plurality of sense amplifiers include detectors configured to detect data transmitted from the memory cells to sense nodes via the corresponding bit lines, and capacitors connected between the sense nodes and a reference potential, respectively, and are provided to be arranged in the second direction from at least a side of one ends of the bit lines. Each of k capacitors corresponding to k detectors, where k is equal to or greater than 2, has a width corresponding to widths of the k detectors, the k capacitors are arranged in the second direction, and the k detectors are arranged in the first direction.

11 Claims, 7 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2010-212378, filed on Sep. 22, 2010, the entire contents of which are incorporated herein by reference.

FIELD

The embodiments of the present invention relate to a semiconductor storage device.

BACKGROUND

NAND flash memories attract public attention as one type of semiconductor storage devices. The NAND flash memories are small-sized nonvolatile semiconductor storage devices capable of storing a large amount of data and have higher integration and larger capacity than NOR flash memories.

In recent years, demand of further downscaling rises for the NAND flash memories to reduce cost per bit and to realize larger capacity. To meet the demand, it is necessary to narrow wire widths of bit lines BL and word lines WL and a distance between wires (line-and-space width). This necessitates narrowing an arrangement interval (pitch) of sense amplifiers SA connected to the bit lines BL.

That is, when the pitch of the bit lines BL is narrower, it is necessary to extend a sense capacitor in an extension direction of the bit lines BL (to outside of a memory cell array). If the sense capacitor is long and narrow in one direction, the ratio of the area of a gap between adjacent sense capacitors to that of one sense capacitor disadvantageously increases. This means that unnecessary areas increase in the layout of the sense amplifiers SA.

DETAILED DESCRIPTION

A semiconductor storage device according to the present embodiment includes plurality of word lines extending in a first direction, plurality of bit lines extending in a second direction to intersect with the word lines, and a memory cell array including plurality of memory cells connected to the word lines and the bit lines. Plurality of sense amplifiers include detectors configured to detect data transmitted from the memory cells to sense nodes via the corresponding bit lines, and capacitors connected between the sense nodes and a reference potential, respectively, and are provided to be arranged in the second direction from at least a side of one ends of the bit lines. Each of k capacitors corresponding to k detectors, where k is equal to or greater than 2, has a width corresponding to widths of the k detectors, the k capacitors are arranged in the second direction, and the k detectors are arranged in the first direction.

Embodiments will now be explained with reference to the accompanying drawings.

Figure 1:
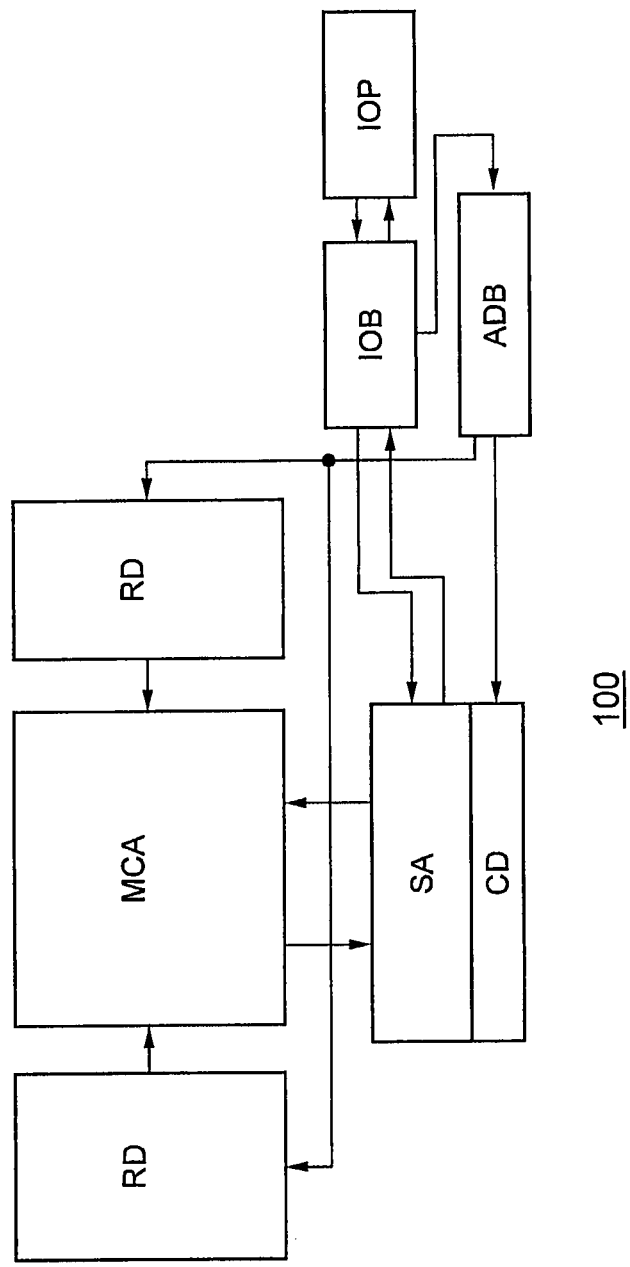
FIG. 1 is a block diagram showing a configuration of relevant parts of a NAND flash memory 100 according to one embodiment.
Figure 2:
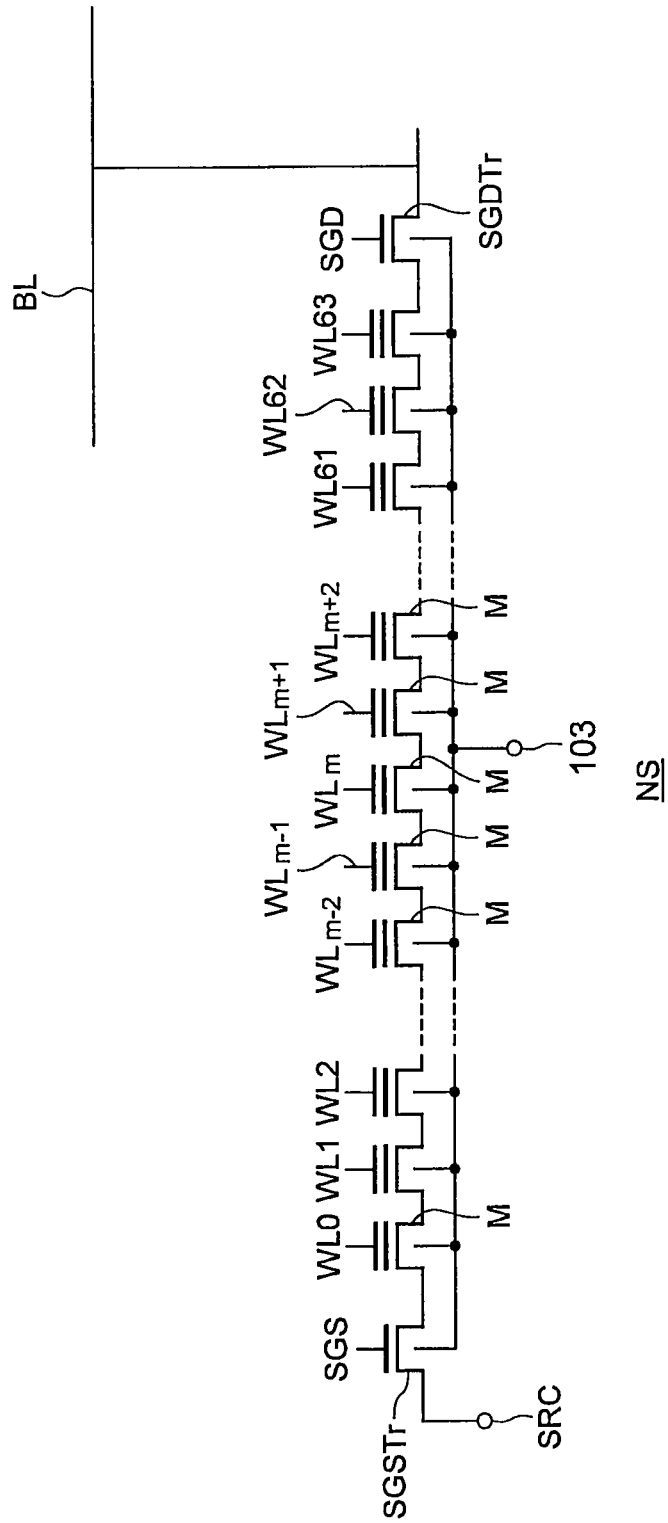
FIG. 2 is a circuit diagram showing a circuit configuration of a NAND string NS in a column direction in a memory cell array MCA shown in FIG. 1.

FIG. 1 is a block diagram showing a configuration of relevant parts of a NAND flash memory (hereinafter, also simply "memory") 100 according to one embodiment. FIG. 2 is a circuit diagram showing a circuit configuration of a NAND string NS in a column direction in a memory cell array MCA shown in FIG. 1. Note that the embodiment can be easily applied to a semiconductor storage device such as a NOR flash memory other than the NAND flash memory.

The NAND string NS is configured to include plurality of memory cells M connected in series and two select gate transistors SGSTr and SGDTr connected to opposite ends of the series-connected memory cells M, respectively. The source-side select gate transistor SGSTr is connected to a source line SRC and the drain-side select gate transistor SGDTr is connected to the corresponding bit line BL.

As shown in FIG. 1, the NAND flash memory 100 includes the memory cell array MCA, a row decoder RD, sense amplifiers SA, a column decoder CD, a data input/output buffer JOB, an address buffer ADB, and an input/output pad IOP.

The memory cell array MCA includes plurality of memory cells M connected to plurality of word lines WL extending in a row direction, which is a first direction, and to plurality of bit lines BL extending in the column direction, which is a second direction. In the present embodiment, the word lines WL are orthogonal to the bit lines BL. The memory cells M are provided to correspond to intersections between the word lines WL and the bit lines BL, respectively. A gate of each memory cell M is connected to one of the word lines WL and a drain thereof is connected to one of the bit lines BL. As shown in FIG. 2, the series-connected memory cells M constitute one NAND string NS.

The row decoder RD includes a word-line driving circuit to select one of the word lines WL in the memory cell array MCA according to an input address and drive the selected word line WL.

Each of the sense amplifiers SA senses a voltage applied to the corresponding bit line BL or a current flowing through the corresponding bit line BL in a write operation and a read operation.

The column decoder CD performs selection of the bit lines BL in the memory cell array MCA according to an input address. Normally, the selection is performed on a byte basis. That is, the column decoder CD selects eight adjacent bit lines BL.

The data input/output buffer IOB temporarily stores data read in the read operation and outputs the data to the outside of a chip via the input/output pad IOP.

The address buffer ADB temporarily stores addresses of memory cells MC received from the outside via the input/output pad IOP and transfers the addresses to the row decoder RD or the column decoder CD.

Although not shown, the memory 100 also includes a control-signal generation circuit, an internal-voltage generation circuit, and the like.

Such external control signals as a chip enable signal CE, a write enable signal WE, a read enable signal RE, an address-latch enable signal ALE, and a command-latch enable signal CLE are input to the input/output pad IOP from the outside of the chip. The memory 100 executes various operations including read, write, and erase operations according to these external control signals.

Each of the memory cells M shown in FIG. 2 can store either single-bit data or multi-bit data. That is, either single-bit cells or multi-bit cells can be used as the memory cells M according to the present embodiment. Each of the sense amplifiers SA detects the data in the memory cells M via the corresponding bit line BL.

Figure 3:
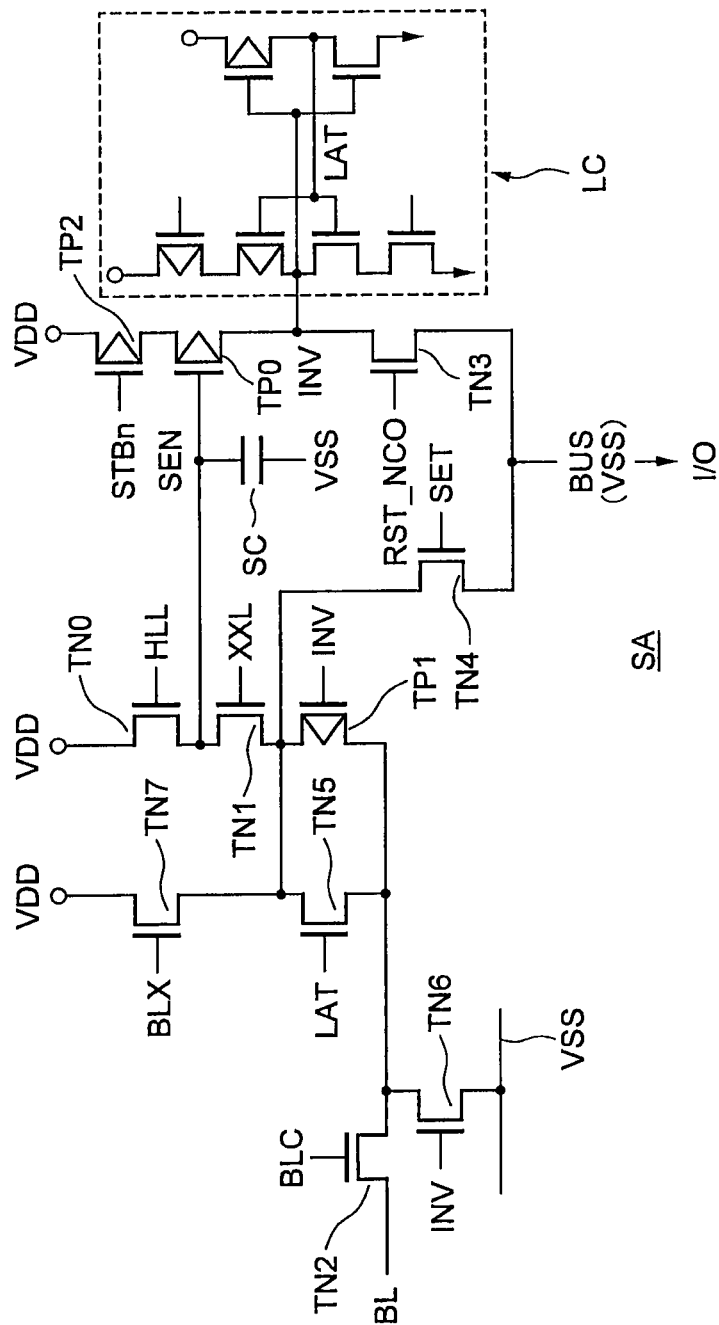
FIG. 3 is a circuit diagram showing an example of an internal configuration of each sense amplifier SA.

FIG. 3 is a circuit diagram showing an example of an internal configuration of each sense amplifier SA. The sense amplifier SA includes a P-type transistor TP0 connected between a power source VDD and a latch circuit LC. The gate of the transistor TP0 is connected to a sense node SEN and the transistor TP0 is configured to carry a current according to a voltage of the sense node SEN.

The sense node SEN is connected to a reference potential source VSS via a sense capacitor SC. The sense capacitor SC is provided to suppress noise transmitted to the sense node SEN and to keep detection sensitivity of the sense node SEN high.

The sense node SEN is connected to the power source VDD via an N-type transistor TN0 that is turned on at the time of precharging the sense node SEN. The sense node SEN is also connected to the bit line BL via an N-type transistor TN1, a P-type transistor TP1, and an N-type transistor TN2.

At the time of precharging, the transistors TN0, TN1, TP1, and TN2 are turned on to charge the sense node SEN with a high level voltage VDD. The bit line BL is precharged with a desired voltage by setting the transistor TN2 to have a bit line voltage VBL+Vtn (for example, VBL=0.5 volt). Furthermore, the voltage of the bit line BL can be kept constant during detection by setting a transistor TN7 to have a voltage of VBL+Vtn+α (for example, α=0.2 volt). When detecting data in the memory cells M, the power source VDD is disconnected from the sense node SEN and the bit line BL by turning off the transistor TN0. At this time, a current according to a conduction state of the memory cells M flows from the sense node SEN to the memory cells M via the bit line BL. When the memory cells M are in a conduction state (for example, data "1"), the potential of the sense node SEN falls and the transistor TP0 is turned on. When the memory cells M are in a non-conduction state (for example, data "0"), the potential of the sense node SEN does not fall and the transistor TP0 keeps turned off. At this time, the transistor TN2 controls the current flowing through the bit line BL and the memory cells M to determine a falling speed of the potential of the sense node SEN. A P-type transistor TP2 determines a timing of transmitting the potential of the sense node SEN to the latch circuit LC according to a strobe signal STB.

A node INV is set to a low level voltage VSS via a reset transistor TN3 before the detection operation. At the time of detection, the node INV transmits a voltage according to a conduction state of the transistor TP0 to the latch circuit LC. When the transistor TP0 is turned on, the node INV is set to logic high by being connected to the high level voltage VDD. A node LAT keeps logic low because it holds data opposite in logic to the node INV. On the other hand, when the transistor TP0 keeps turned off, the node INV keeps logic low and the node LAT keeps logic high.

The data held by the latch circuit LC can be output from the input/output pad IOP via a bus BUS.

An N-type transistor TN4 is a reset transistor provided to fix the potential of the bit line BL to the low level voltage VSS after the detection operation. The bit line BL is reset to the low level voltage VSS via the transistors TN4 and TP1 (or TN5) after the detection operation.

A transistor TN6 is provided to apply the low level voltage VSS to the memory cells M via the bit line BL in the write operation.

Figure 4:
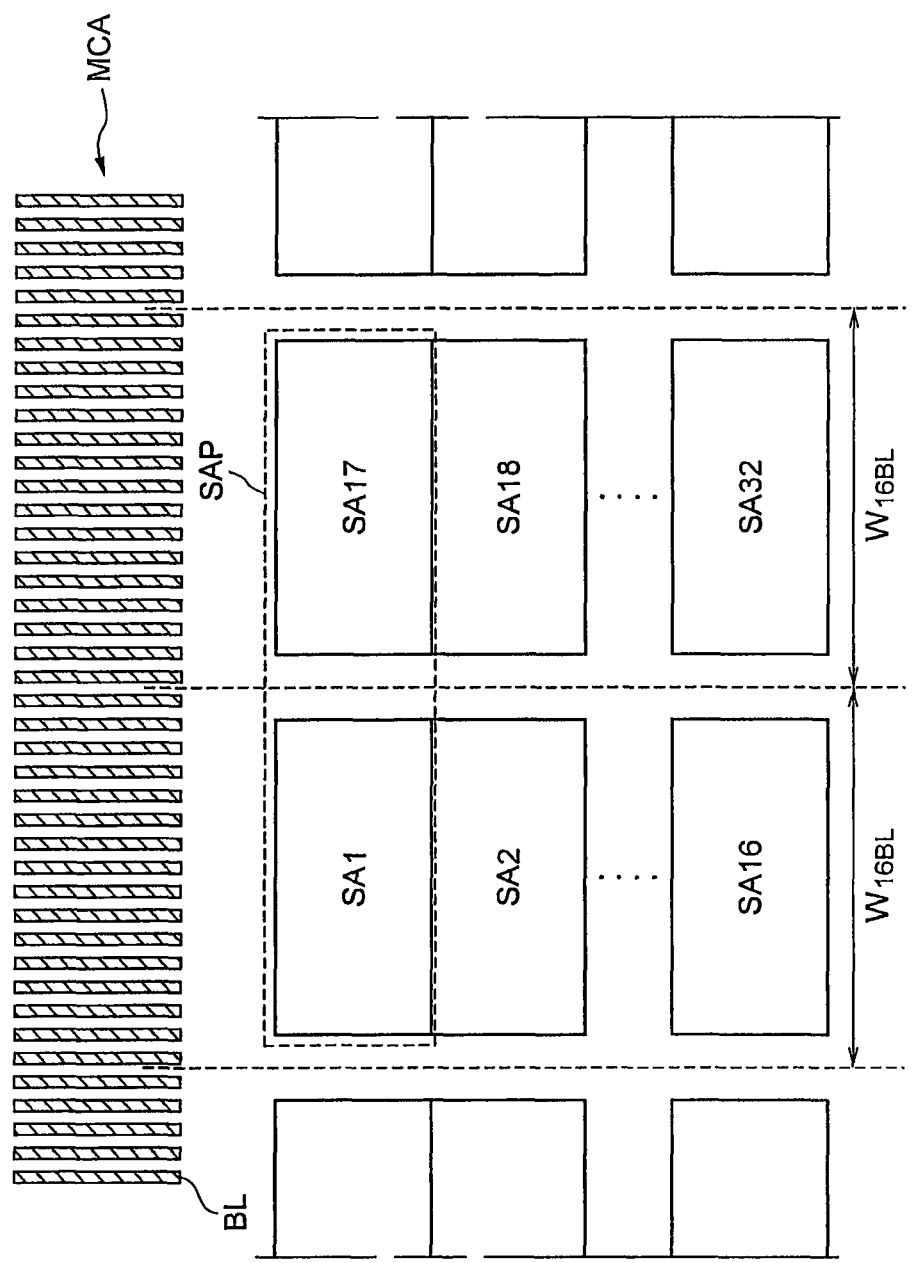
FIG. 4 is a plan layout chart showing a relation between the bit lines BL and the sense amplifiers SA.

FIG. 4 is a plan layout chart showing a relation between the bit lines BL and the sense amplifiers SA. While FIG. 4 shows that the sense amplifiers SA are elongated in the row direction (laterally long) for the sake of convenience, the sense amplifiers SA are normally formed elongated in the column direction (longitudinally long).

The sense amplifiers SA are provided on a side surface of the memory cell array MCA in the column direction. That is, the sense amplifiers SA are provided on a one-end side of the bit lines BL. Each sense amplifier SA is formed to have a width corresponding to a total width of plurality of bit lines BL. For example, the sense amplifier SA is formed to have a width $W_{16BL}$ corresponding to line-and-space widths of 16 bit lines BL. To distinguish the wire width of the bit line BL itself from the line-and-space width of the bit line BL, the line-and-space width of the bit line BL is also referred to as "pitch". The width $W_{16BL}$ corresponds to the pitches of the 16 bit lines BL.

In the present embodiment, the sense amplifiers SA are provided to correspond to the bit lines BL, respectively. Therefore, the number of sense amplifiers SA is equal to that of bit lines BL. The 16 sense amplifiers SA corresponding to the 16 bit lines BL are provided to be arranged in the column direction from the one-end side of the bit lines BL with the width corresponding to the pitches of the 16 bit lines BL. That is, the 16 sense amplifiers SA1 to SA16 are arranged tandemly from the one-end side of the bit lines BL (an end of the memory cell array MCA) in the column direction.

The two sense amplifiers SA adjacent in the row direction constitute a sense amplifier pair SAP. For example, the sense amplifiers SA1 and SA17 constitute one sense amplifier pair SAP. Likewise, the sense amplifiers SA2 and SA18, SA3 and SA19, ... and SA16 and SA23 constitute sense amplifier pairs SAP, respectively.

Generally, the sense amplifiers SA are laid out at a pitch that is an integer multiple (for example, eightfold) of the pitch (line-and-space width) of one bit line BL. When the sense amplifiers SA are provided to correspond to the respective bit lines BL, x sense amplifiers SA (where x is an integer) corresponding to x bit lines BL are formed with a width corresponding to pitches of the x bit lines BL, respectively, and arranged outward of the memory cell array MCA in the extension direction of the bit lines BL. Due to this, narrowing the pitch of the bit line BL requires narrowing the pitch (width) of the plane layout of the sense amplifier SA.

Normally, an amplifier circuit, a latch circuit, and the like formed by transistors included in each sense amplifier SA can be scaled down according to the reduction in the pitch of the bit line BL. However, to keep high sensitivity and improve noise resistance, the sense capacitor connected to the sense node in the sense amplifier SA is difficult to scale down. That is, the sense amplifiers SA in the memories of all generations include sense capacitors at an almost equal size (area), respectively.

Figure 5:
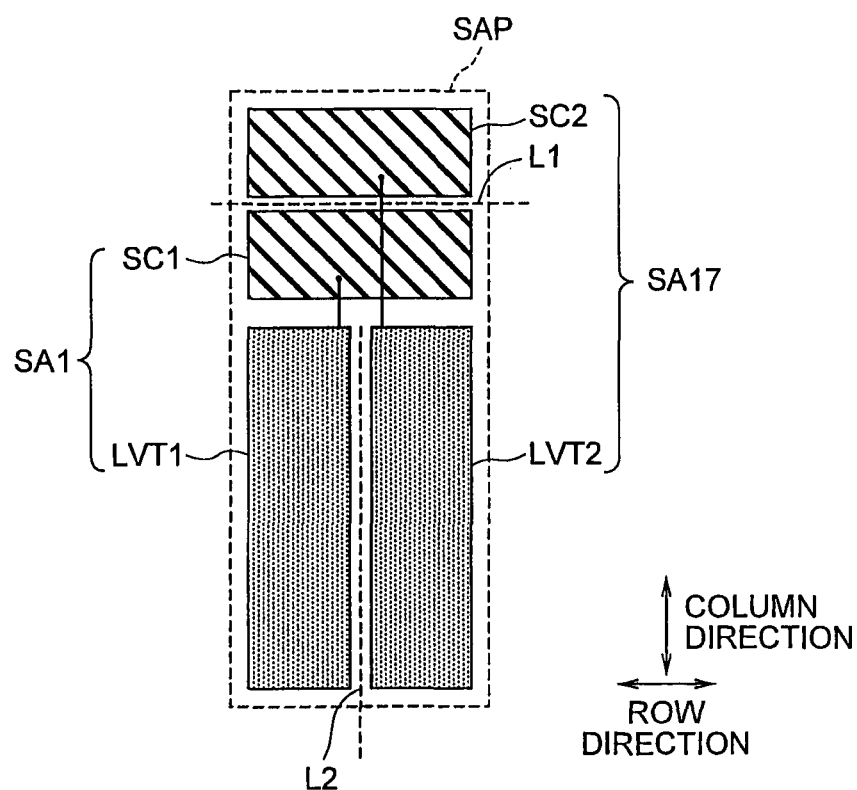
FIG. 5 is a plan layout chart showing a configuration of one sense amplifier pair SAP.

FIG. 5 is a plan layout chart showing a configuration of one sense amplifier pair SAP. The sense amplifier pair SAP includes, for example, the sense amplifiers SA1 and SA17.

The sense amplifier SA1 includes a region where a sense capacitor SC1 is formed and a region where a LV transistor circuit LVT1 is formed. The sense amplifier SA17 includes region where a sense capacitor SC2 is formed and a region where a LV transistor circuit LVT2 is formed.

Note that the sense capacitors SC1 and SC2 correspond to the sense capacitor SC shown in FIG. 3. The LV transistor circuits LVT1 and LVT2 correspond to low voltage transistors constituting the sense amplifier SA such as the transistors TN0 to TN7, TP0, and TP1, and transistors of the latch circuit LC shown in FIG. 3. Therefore, each of the LV transistor circuits LVT1 and LVT2 functions as a detecting unit detecting data transmitted to the sense node SEN from the memory cells M via the bit line BL. The sense capacitor SC is connected between the sense node SEN and the reference potential VSS and suppresses noise.

Each of the two sense capacitors SC1 and SC2 in the sense amplifier pair SAP is formed to have a width corresponding to a total width of the two LV transistor circuits LVT1 and LVT2 in the same sense amplifier pair SAP. The sense capacitors SC1 and SC2 are arranged tandemly in the column direction in a region of the sense amplifier pair SAP. That is, the sense capacitors SC1 and SC2 are arranged to spread over regions of the two sense amplifiers SA adjacent to each other in the column direction.

The LV transistor circuit LVT1 is formed to have a width corresponding to pitches of the corresponding 16 bit lines BL as shown in FIG. 4. The LV transistor circuit LVT2 is also formed to have a width corresponding to pitches of the corresponding 16 bit lines BL. The two LV transistor circuits LVT1 and LVT2 in the same sense amplifier pair SAP are arranged in the row direction.

The two sense capacitors SC1 and SC2 adjacent in the column direction are arranged along a line L1 therebetween in the row direction as reflected images with respect to each other. Normally, a certain distance is necessary to keep between a well in which the sense capacitor SC is formed in the corresponding sense amplifier SA and a well where the LV transistor circuit LVT is formed in the corresponding sense amplifier SA so as to isolate the two wells from each other. However, in the present embodiment, the sense capacitors SC1 and SC2 are arranged adjacently as reflected images with respect to each other. Due to this, the wells in which the sense capacitors SC1 and SC2 are formed can be combined into one. This can reduce the layout area of the sense amplifier pair SAP.

Furthermore, regions of the two LV transistor circuits LVT1 and LVT2 adjacent in the row direction are arranged as reflected images with respect to each other along a line L2 therebetween in the column direction. This enables wires (such as a power source line) to be shared between the adjacent sense amplifiers SA1 and SA17. Therefore, the layout area of the sense amplifier pair SAP can be further reduced.

Figures 6A, 6B:
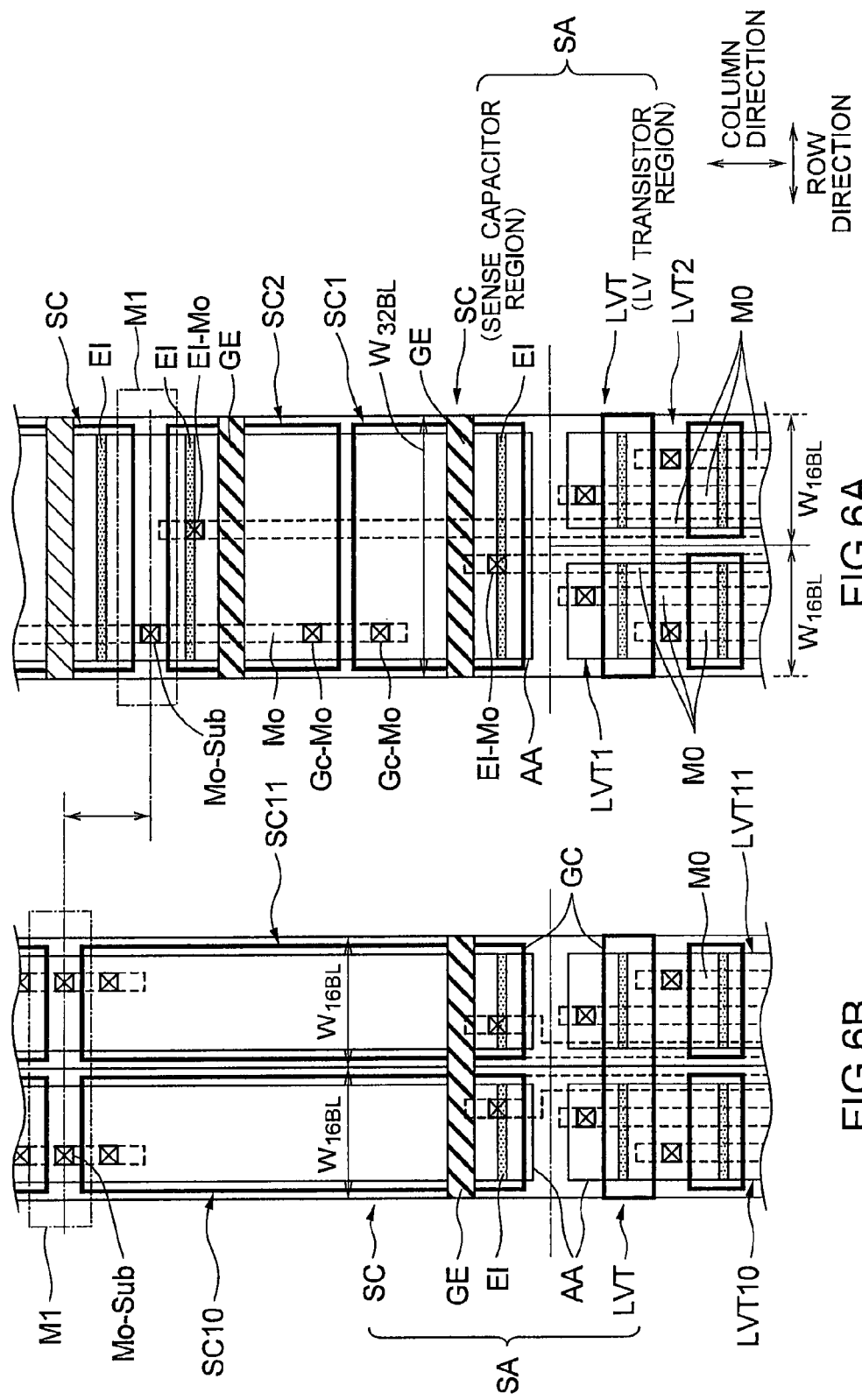
FIG. 6A is a layout chart showing the configuration of the sense amplifier pair SAP according to the present embodiment in detail.
FIG. 6B is a layout chart showing a configuration of a sense amplifier pair SAP according to a comparison example.

FIG. 6A is a layout chart showing the configuration of the sense amplifier pair SAP according to the present embodiment. FIG. 6B is a layout chart showing a configuration of a sense amplifier pair SAP according to a comparison example.

In the present embodiment, each of the LV transistor circuits LVT1 and LVT2 is formed to have the width $W_{16BL}$ corresponding to the pitches of the 16 bit lines BL, and each of the sense capacitors SC1 and SC2 is formed to have a width $W_{32BL}$ corresponding to the pitches of the two LV transistor circuits LVT1 and LVT2, as shown in FIG. 6A. The width $W_{32BL}$ is twice as large as the width $W_{16BL}$. The sense capacitors SC1 and SC2 are arranged in the column direction (longitudinal direction).

Figure 7:
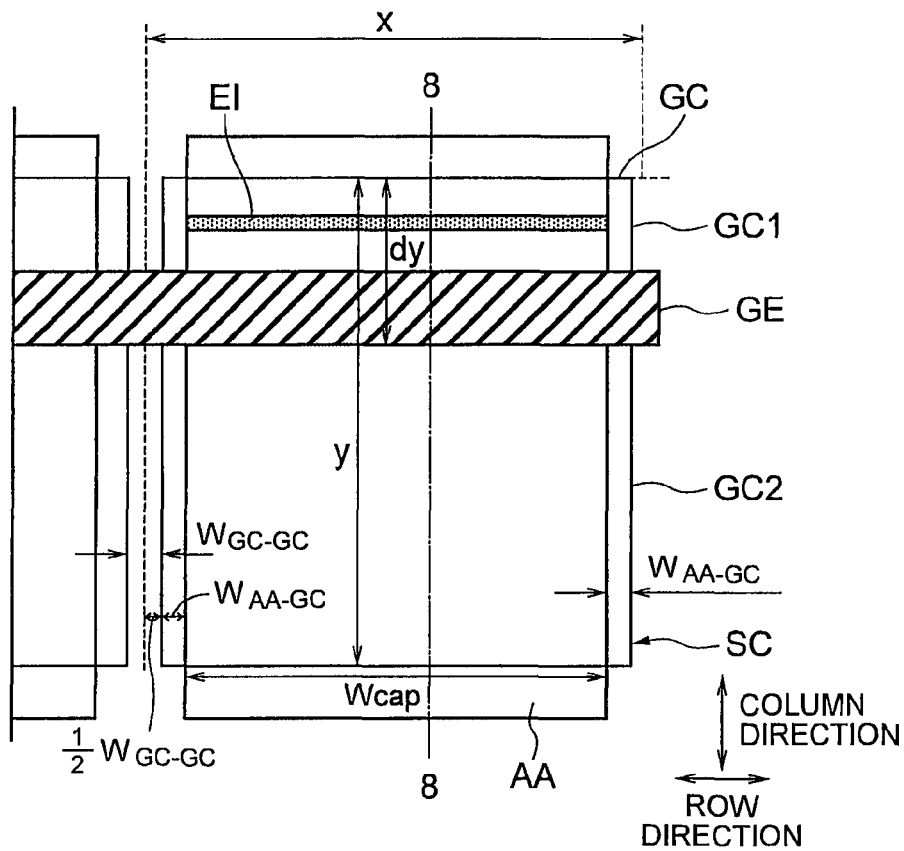
FIG. 7 is a plan layout chart showing a configuration of the sense capacitor SC according to the present embodiment and peripheries thereof.
Figure 8:
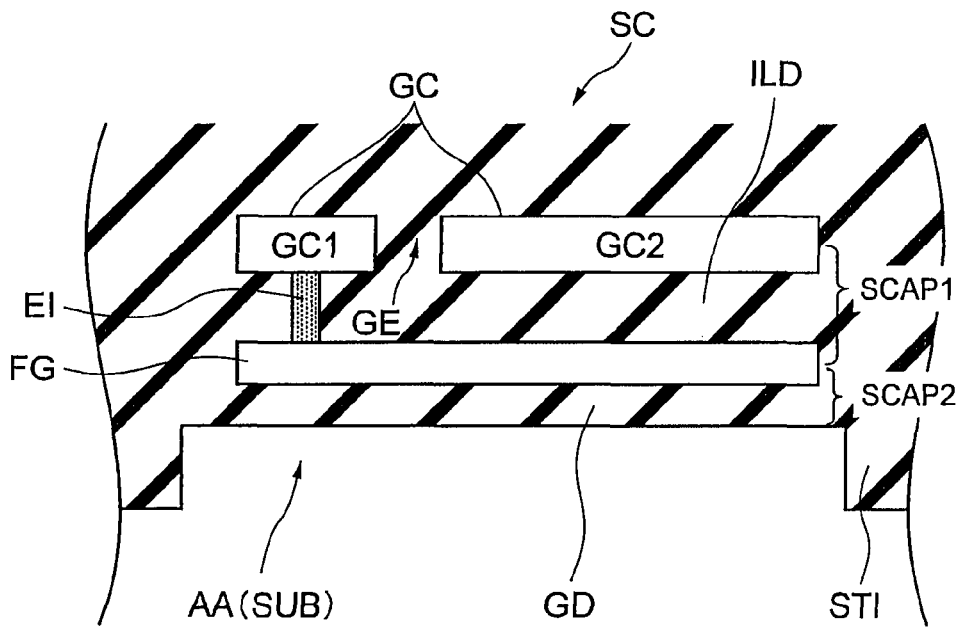
FIG. 8 is a cross-sectional view taken along a line 8-8 of FIG. 7.

FIG. 7 is a plan layout chart showing a configuration of the sense capacitor SC according to the present embodiment and peripheries thereof. FIG. 8 is a cross-sectional view taken along a line 8-8 of FIG. 7.

As shown in FIG. 8, the sense capacitor SC is formed on an active area AA isolated by an element isolation region STI (Shallow Trench Isolation). The sense capacitor SC is formed through the same manufacturing process as that for the LV transistor circuit LVT. Accordingly, constituent elements (materials) are common to the sense capacitor SC and the LV transistor circuit LVT.

For example, the sense capacitor SC includes a gate dielectric film GD provided on the active area AA, a floating gate FG provided on the gate dielectric film GD, an interlayer dielectric film ILD provided on the floating gate FG, and a control gate GC provided on the interlayer dielectric film ILD. While all of the constituent elements are used to constitute the transistor in the LV transistor circuit LVT, these constituent elements are used to constitute the sense capacitor SC in FIG. 8. Therefore, note that the floating gate FG, the control gate GD, and the like function as electrodes of the sense capacitor SC differently from their original functions.

In one sense capacitor SC, an insulation film region GE dielectrically separates the control gate GC into two control gate parts GC1 and GC2. The control gate part GC1 is electrically connected to the floating gate FG by a metal plug EI formed in the interlayer dielectric film ILD. Although not shown in FIG. 8, the control gate part GC2 is electrically connected to the active area AA (a semiconductor substrate SUB). Note that the metal plug EI is used to connect the control gate to the floating gate in each of select gates SGS and SGD shown in FIG. 2. In the present embodiment, this metal plug EI is used for the sense capacitor SC.

One sense capacitor SC includes sub capacitors SCAP1 and SCAP2. The sub capacitor SCAP1 includes the control gate part GC2 and the floating gate FG as electrodes, and the interlayer dielectric film ILD between the control gate part GC2 and the floating gate FG as an insulation film between the electrodes. The sub capacitor SCAP2 includes the floating gate FG and the active area AA (the semiconductor substrate SUB) as electrodes, and the gate dielectric film GD between the floating gate FG and the active area AA as an insulation film between the electrodes.

The sub capacitors SCAP1 and SCAP2 are connected in parallel because the control gate part GC2 is electrically connected to the semiconductor substrate SUB. Accordingly, a total capacity of the sense capacitor SC is the sum of capacities of the sub capacitors SCAP1 and SCAP2. In this way, the sense capacitor SC included in the memory 100 according to the present embodiment can increase the capacity while suppressing the layout area of the sense capacitor SC by using the floating gate FG and the control gate CG.

Even if the memory cell M is downscaled, both the channel width (W) and the channel length (L) in the memory cell M are reduced and therefore a W/L ratio of the memory cell M hardly changes. When the W/L ratio of the memory cell M has no change, a cell current flowing through the memory cell M has no change either during detection. Due to this, even if the memory cell M is downscaled, the sense capacitor SC cannot be similarly reduced and the ratio of the layout area of the sense capacitor SC to that of the sense amplifier SA increases. It is, therefore, important to reduce the layout area of the sense capacitor SC without changing the capacity thereof.

The semiconductor substrate SUB is fixed to a reference potential (for example, VSS) in the normal operation. On the other hand, the control gate part GC1 is connected to the LV transistor circuit LVT (the sense node SEN).

As shown in FIG. 7, the control gate GC protrudes from ends of the active area AA in the row direction to increase the capacity. It is assumed that the width of the control gate GC protruding from each end of the active area AA is $W_{AA-GC}$. It is also assumed that the distance between the control gates GC adjacent in the column direction is $W_{GC-GC}$. Considering misalignment during the manufacturing process, the widths $W_{AA-GC}$ and $W_{GC-GC}$ cannot be narrowed. That is, the distance between the sense capacitors SC adjacent in the row direction hardly changes even if the pitches of the bit lines BL and the word lines WL are narrowed.

Therefore, if the pitch of the bit line BL is narrower, it is necessary to further narrow the width of the sense capacitor SC in the row direction while keeping the widths $W_{AA-GC}$ and $W_{GC-GC}$ unchanged.

Referring back to FIG. 6A, wires (hereinafter, also "M0 wires") including wires M0 made of a lower-layer metal extend in the column direction. The M0 wires connect the LV transistor circuit LVT1 to the sense capacitor SC1 and the LV transistor circuit LVT2 to the sense capacitor SC2. The M0 wire also connects the control gate part GC2 to the semiconductor substrate SUB shown in FIG. 8.

A contact EI-M0 is a contact that connects the metal plug EI (a control gate part CG1) functioning as one of the electrodes of the sense capacitor SC1 to the M0 wire. The sense capacitor SC1 is connected to the sense node SEN of the LV transistor circuit LVT1 via the M0 wire and the contact EI-M0. The sense capacitor SC2 is connected to the sense node SEN of the LV transistor circuit LVT2 via the M0 wire and another contact EI-M0.

A contact GC-M0 is a contact that connects the control gate part GC2 functioning as one of the electrodes of the sub capacitor SCAP1 to the semiconductor substrate SUB functioning as one of the electrodes of the sub capacitor SCAP2. The contact GC-M0 is also connected to a metal wire M1 that is an upper layer than the layer of the M0 wire. Although not shown, a multilayer wire structure can be further formed on the metal wire M1.

The sense amplifier pair SAP in the comparison example shown in FIG. 6B is similar to that according to the present embodiment shown in FIG. 6A in that each of LV transistor circuits LVT10 and LVT11 is formed to have the width $W_{16BL}$ corresponding to the pitches of the 16 bit lines BL. However, each of sense capacitors SC10 and SC11 is formed to have the width $W_{16BL}$ corresponding to the pitch of the corresponding LV transistor circuit LVT10 or LVT11. That is, in the comparison example, the entire sense amplifiers SA are each formed to have the width $W_{16BL}$ and 16 sense amplifiers SA are arranged in the column direction (longitudinal direction).

When the pitch of the bit line BL is narrower and a formation width of the sense amplifier SA is narrower, the sense amplifier SA becomes inevitably longer and narrower in the column direction. Particularly in the comparison example, it is necessary to largely extend in the column direction the sense capacitors SC10 and SC11 difficult to downscale so as to keep the layout area unchanged. In this case, the ratio of the distance $W_{GC-GC}$ between the control gates GC and the widths $W_{AA-GC}$ of the control gate GC to the width of the sense capacitor SC increases. Accordingly, when the pitch of the bit line BL is narrower, the ratio of the area of the sense capacitor SC to that of the sense amplifier SA decreases accordingly. To keep the capacity of the sense capacitor SC, it is necessary to increase the layout area of the sense amplifier SA. This prevents downscaling of the memory.

On the other hand, in the present embodiment shown in FIG. 6A, the sense capacitors SC1 and SC2 are formed to spread over the plurality of sense amplifiers SA (the sense amplifier pair SPA) adjacent in the row direction. This can dispense with the distance $W_{GC-GC}$ between the control gates GC of the sense capacitors SC1 and SC2 and the widths $W_{AA-GC}$ of the control gate GC. Further, the width of the sense capacitors SC1 and SC2 is twice as large as that of the sense capacitors SC10 and SC11 in the comparison example. As a result, each of the sense capacitors SC1 and SC2 has a shape not elongated rectangle but closer to a square. Due to this, even if the pitch of the bit line BL is narrower and the formation width of the sense amplifier SA is narrower, it is possible to suppress increase in the length of the sense amplifier SA in the column direction. It is also possible to suppress increase in the area of the sense amplifier SA in view of the gap, that is, the distance $W_{GC-GC}$ between the sense capacitors SC1 and SC2 adjacent in the column direction.

Considered now is to what extent the width of the sense amplifier SA is narrowed when advantages of the present embodiment can be attained.

Capacities of the sub capacitors SCAP1 and SCAP2 shown in FIG. 8 are assumed as $C_A$ and $C_B$, respectively. Areas of the sub capacitors SCAP1 and SCAP2 are assumed as Sa and Sb, respectively. It is also assumed that the relative permittivity of the interlayer dielectric film ILD is $\in$a, the thickness of the interlayer dielectric film ILD is da, the relative permittivity of the gate dielectric film GD is $\in$b, and that the thickness of the gate dielectric film GD is db. Because $\in$a, da, $\in$b, and db can be constant, $\in$a/da and $\in$b/db are expressed as Ca and Cb, respectively.

In this case, the following Equations (1) and (2) are derived.

$$C_A = Ca * Sa \quad \text{(Equation 1)}$$

$$C_B = Cb * Sb \quad \text{(Equation 2)}$$

As shown in FIG. 7, it is assumed that the width of the sense amplifier SA in the row direction is x and the length of the control gate GC in the column direction (the length of the floating gate FG in the column direction) is y. The sum of the lengths of the control gate part GC1 and the insulation film region GE in the column direction is assumed as dy.

In this case, the width Wcap of each of the sub capacitors SCAP1 and SCAP2 in the row direction is x−dx. Note that dx is expressed by the following Equation (3) and is constant in the present embodiment.

$$dx = 2 * (W_{AA-GC} + W_{GC-GC}/2) \quad \text{(Equation 3)}$$

The length of the sub capacitor SCAP1 in the column direction is y−dy and that of the sub capacitor SCAP2 is y.

Accordingly, the capacitors $C_A$ and $C_B$ of the sub capacitors SCAP1 and SCAP2 can be expressed by the following Equations (4) and (5), respectively.

$$C_A = Ca*(x-dx)*(y-dy) \quad \text{(Equation 4)}$$

$$C_B = Cb*(x-dx)*y \quad \text{(Equation 5)}$$

Accordingly, the total capacity $C_{total}$ of the sense capacitor SC is expressed by the following Equation (on 6).

$$C_{total} = Ca*(x-dx)*(y-dy) + Cb*(x-dx)*y \quad \text{(Equation 6)}$$

The pitch of the sense amplifier SA in the present embodiment shown in FIG. 6A is twice as wide as that of the sense amplifier SA in the comparison example shown in FIG. 6B ($W_{32BL} = 2W_{16BL}$). Thus, y (hereinafter, "y(x)") in the case where the pitch of the sense amplifier SA is x is compared with y (hereinafter, "y(2x)") in the case where the pitch of the sense amplifier SA is 2x. When $2*y(2x)+W_{GC-GC}$ is smaller than y(x) ($2*y(2x)+W_{GC-GC} < y(x)$), the layout area of the sense amplifier SA can be made smaller than that according to the comparison example without changing the total capacity $C_{total}$ (the area of the sense capacitor SC) in the present embodiment.

$$2*y(2x)+W_{GC\text{-}GC}<y(x) \quad \text{(Equation 7)}$$

The Equation (7) can be paraphrased as follows. The sum of the length (y(2x)) of the sense capacitors SC1 and SC2 in the column direction, each of which is formed to have the width corresponding to the widths of the two sense amplifiers SA (widths of the two LV transistor circuits LVT), and the distance $W_{GC\text{-}GC}$ between the sense capacitors SC1 and SC2 is smaller than ½ of the length (y(x)) of the sense capacitors SC10 and SC11 in the column direction, each of which is formed to have the width of one sense amplifier SA.

Specifically, when it is assumed that $C_{total}$ is 20 fF, $W_{GC\text{-}GC}$ is 0.1 μm, $W_{AA\text{-}GC}$ is 0.1 μm, dx is 0.3 μm, dy is 0.8 μm, Ca is $2.6*10^{-3}$ F/m², and that Cb is $4.6*10^{-3}$ F/m², x satisfies x<1.258 μm. That is, in the present embodiment, when the pitch of the sense amplifier SA (LV transistor LVT region) in the row direction is equal to or lower than 1.25 μm, the layout area of the sense amplifier SA can be made smaller than that in the comparison example.

When x is 1.25 μm, the pitch (line-and-space width) of the bit line BL is about 78 nm. That is, when the pitch of the bit line BL is narrowed to be lower than about 78 nm, the layout area of the sense amplifier SA in the present embodiment can be made smaller than that in the comparison example. Needless to say, a critical value at which the layout area of the sense amplifier SA in the present embodiment is smaller than that in the comparison example is changed by changing numerical values of $C_{total}$, dx, dy, Ca, and Cb without limitation to the specific example shown above.

Taking the recent demand of downscaling into account, the influence of the advantages of downscaling the sense capacitor SC according to the present embodiment is considered to be greater and greater.

In this way, according to the present embodiment, each of the sense capacitors SC corresponding to the LV transistor circuits LVT adjacent in the row direction is formed to have the width corresponding to the widths of the LV transistor circuits LVT, and the sense capacitors SC are arranged tandemly to be adjacent in the column direction. This can increase the ratio of the area of the sense capacitor SC to that of the sense amplifier SA and reduce the area of the sense capacitor SC itself without changing the capacity of the sense capacitor SC. In other words, according to the present embodiment, the ratio of the area of the shallow trench isolation STI, that of the gap between the adjacent control gates GC, and that of the control gate GC to that of the sense amplifier SA can be reduced. As a result, it is possible to suppress the unnecessary area in the layout of the sense amplifier SA even if the width of the bit line BL or the distance between the bit lines BL is narrowed.

In the present embodiment, the two sense capacitors SC corresponding to the two LV transistor circuits LVT adjacent in the row direction are each formed to have the width corresponding to the widths of the two LV transistor circuits LVT and are arranged tandemly to be adjacent in the column direction. Alternatively, when the pitch of the bit line BL is reduced or the capacity of the sense capacitor SC is increased, k sense capacitors SC (where k is an integer equal to or greater than 3) corresponding to k LV transistor circuits LVT arranged in the row direction can be each formed to have a width corresponding to widths of the k LV transistor circuits LVT and can be arranged tandemly in the column direction. In this alternative, the k LV transistor circuits LVT and the k corresponding sense capacitors SC constitute k sense amplifiers SA, respectively. The k sense amplifiers SA are formed as one group.

In this case, the total length (y(k*x)) of the sense capacitors SC1 to SCk in the column direction, each of which is formed to have the width corresponding to widths of the k sense amplifiers SA (widths of the LV transistor circuits LVT), is smaller than 1/k of the length (y(x)) of each of the sense amplifiers SC10 and SC11 in the column direction, each of which is formed to have the width of one sense amplifier SA in the comparison example. This is the condition for applying the present embodiment. That is, a general formula as expressed by the following Equation (8) is derived.

$$k*y(k*x)+(k-1)W_{GC\text{-}GC}<y(x) \quad \text{(Equation 8)}$$

In this way, according to the present embodiment, the sense capacitors C laid out at the pitch that is k times as large as the width of one LV transistor circuit LVT can be arranged. This can further suppress increase in the area of the sense amplifier SA.

Moreover, the degree of freedom of positions of the contacts connected to the sense capacitor SC increases by extending the width (pitch) of the sense capacitor SC in the column direction. Furthermore, in the present embodiment, the width of the sense capacitor SC in the column direction is large. Due to this, the M0 wires have fewer bent portions than those according to the conventional technique, as can be evident from comparison between FIGS. 6A and 6B. Because the wires have fewer bent portions, lithography in steps of forming the M0 wires is relatively easy. Therefore, the present embodiment is superior to the conventional technique also in ease of manufacturing.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   plurality of word lines extending in a first direction;
   plurality of bit lines extending in a second direction to intersect with the word lines;
   a memory cell array including plurality of memory cells connected to the word lines and the bit lines; and
   plurality of sense amplifiers comprising detectors configured to detect data transmitted from the memory cells to sense nodes via the bit lines corresponding to the sense amplifiers, and capacitors connected between the sense nodes and a reference potential, respectively, wherein
   the sense amplifiers are provided to be arranged in the second direction from at least a one-end side of the bit lines,
   k capacitors corresponding to k detectors, where k is equal to or greater than 2, each have a width corresponding to widths of the k detectors and are arranged in the second direction, and
   the k detectors are arranged in the first direction.

2. The device of claim 1, wherein
   the k detectors and the k capacitors corresponding thereto constitute k sense amplifiers, respectively, and
   the k sense amplifiers constitute a group of sense amplifiers.

3. The device of claim 1, wherein
the k is 2 and the two detectors are arranged as reflected images with respect to each other along a line between the two detectors in the second direction, and
the two capacitors are arranged as reflected images with respect to each other along a line between the two capacitors in the first direction.

4. The device of claim 2, wherein
the k is 2 and the two detectors are arranged as reflected images with respect to each other along a line between the two detectors in the second direction, and
the two capacitors are arranged as reflected images with respect to each other along a line between the two capacitors in the first direction.

5. The device of claim 2, wherein the sense amplifiers are provided to correspond to the bit lines, respectively.

6. The device of claim 3, wherein the sense amplifiers are provided to correspond to the bit lines, respectively.

7. The device of claim 1, wherein a length in the second direction of each of the capacitors having the width corresponding to the widths of the k detectors is smaller than 1/k of a length in the second direction of each of the capacitors having a width of one of the detectors.

8. The device of claim 2, wherein a length in the second direction of each of the capacitors having the width corresponding to the widths of the k detectors is smaller than 1/k of a length in the second direction of each of the capacitors having a width of one of the detectors.

9. The device of claim 3, wherein a length in the second direction of each of the capacitors having the width corresponding to the widths of the k detectors is smaller than 1/k of a length in the second direction of each of the capacitors having a width of one of the detectors.

10. The device of claim 5, wherein a length in the second direction of each of the capacitors having the width corresponding to the widths of the k detectors is smaller than 1/k of a length in the second direction of each of the capacitors having a width of one of the detectors.

11. The device of claim 1, wherein the device is a NAND-type flash memory.

* * * * *